United States Patent
Nomura (10) Patent No.: US 6,697,400 B2
(45) Date of Patent: Feb. 24, 2004

(54) CIRCUIT FOR DRIVING A LASER DIODE WHICH HAS A FEED-FORWARD TYPE APC CIRCUIT AND METHOD FOR DRIVING A LASER DIODE BY USING THE APC CIRCUIT

(75) Inventor: Rintaro Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/066,776

(22) Filed: Feb. 6, 2002

(65) Prior Publication Data

US 2002/0105983 A1 Aug. 8, 2002

(30) Foreign Application Priority Data

Feb. 8, 2001 (JP) ........................................ 2001-032464

(51) Int. Cl.[7] ................................................ H01S 3/00
(52) U.S. Cl. ................ 372/38.02; 372/38.1; 372/38.01; 372/38.07
(58) Field of Search ............................ 372/38.02, 38.1, 372/38.01, 38.07

(56) References Cited

U.S. PATENT DOCUMENTS

| | | | | |
|---|---|---|---|---|
| 5,019,769 A | * | 5/1991 | Levinson | 372/31 |
| 5,208,782 A | * | 5/1993 | Sakuta et al. | 365/230.03 |
| 5,521,990 A | * | 5/1996 | Ishizawa et al. | 382/270 |
| 5,553,170 A | * | 9/1996 | Kumagai | 382/283 |
| 5,867,439 A | * | 2/1999 | Asakura et al. | 365/222 |
| 6,292,497 B1 | * | 9/2001 | Nakano | 372/29.015 |

FOREIGN PATENT DOCUMENTS

| | | |
|---|---|---|
| JP | 57-3451 | 1/1982 |
| JP | 6-112905 | 4/1994 |
| JP | 11-135871 | 5/1999 |

* cited by examiner

*Primary Examiner*—Paul Ip
*Assistant Examiner*—Leith A Al-Nazer
(74) *Attorney, Agent, or Firm*—McGinn & Gibb, PLLC (57) ABSTRACT

In a circuit for a driving laser diode which has a feed-forward type APC circuit, the average value of an input signal A is detected by an average value detector, and the value corresponding to the mark rate thereof is input to a memory control circuit. The memory control circuit is connected to plural memories (memory A, memory B, memory C). Each of the memories stores data having different characteristics according to the temperature with respect to the value corresponding to pulse driving current Iac of a laser diode and the value corresponding to bias driving current Idc of the laser diode. The memory control circuit selects a memory to be used according to the mark rate detected, reads out the value corresponding to the pulse driving current Iac and the value corresponding to the bias current Idc according to the temperature from a temperature sensor, and determines the pulse driving current Iac and the bias current Idc.

18 Claims, 9 Drawing Sheets

FIG.1
(PRIOR ART)

FIG.3A (PRIOR ART) DENSITY OF BURST CELLS IS HIGH (MARK RATE IS LARGE)

FIG.3B (PRIOR ART) DENSITY OF BURST CELLS IS LOW (MARK RATE IS SMALL)

FIG.4

FIG.5A DENSITY OF BURST CELLS IS HIGH (MARK RATE IS LARGE)

FIG.5B DENSITY OF BURST CELLS IS A LITTLE HIGH (MARK RATE IS A LITTLE LARGE)

FIG.5C DENSITY OF BURST CELLS IS LOW (MARK RATE IS SMALL)

FIG.6A MEMORY A

FIG.6B MEMORY B

FIG.6C MEMORY C

CIRCUIT FOR DRIVING A LASER DIODE WHICH HAS A FEED-FORWARD TYPE APC CIRCUIT AND METHOD FOR DRIVING A LASER DIODE BY USING THE APC CIRCUIT

BACKGROUND OF THE INVENTION

1. Field of the Invention

The present invention relates to a laser diode driving circuit having a feed-forward type APC (Auto Power Control) circuit for compensating variation of peak power of light output due to variation of the mark rate in an optical transmitter supporting burst mode.

2. Description of the Related Art

Figure 1:
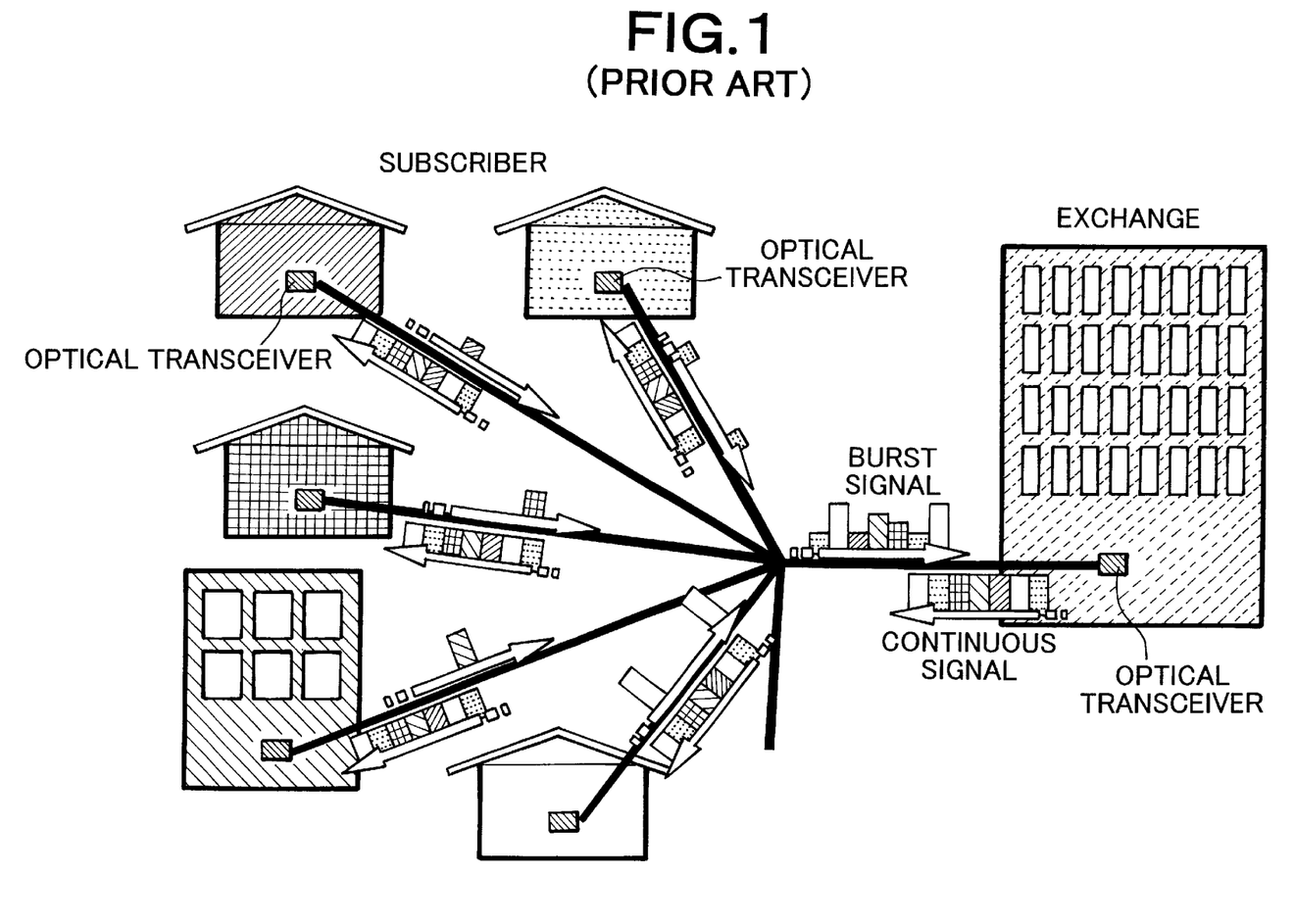
FIG. 1 is a diagram showing a PON system.

In a PON (Passive Optical Network) system (for example, ATM-PON (Asynchronous Transfer Mode-Passive Optical Network)) shown in FIG. 1, the transmission line of a fiber from a exchange is dispersed to plural fibers by a star coupler. In order to perform interactive transmission/reception through a single-core fiber, burst transmission is used for an up-signal output from each subscriber so that the up-signal conflicts with up-signals output from the other subscribers. Various optical transmission systems have been proposed in order that an optical transmitter for up-signals supports the burst transmission, and a feed-forward type APC has been frequently used as one of the optical transmission systems.

Figure 2:
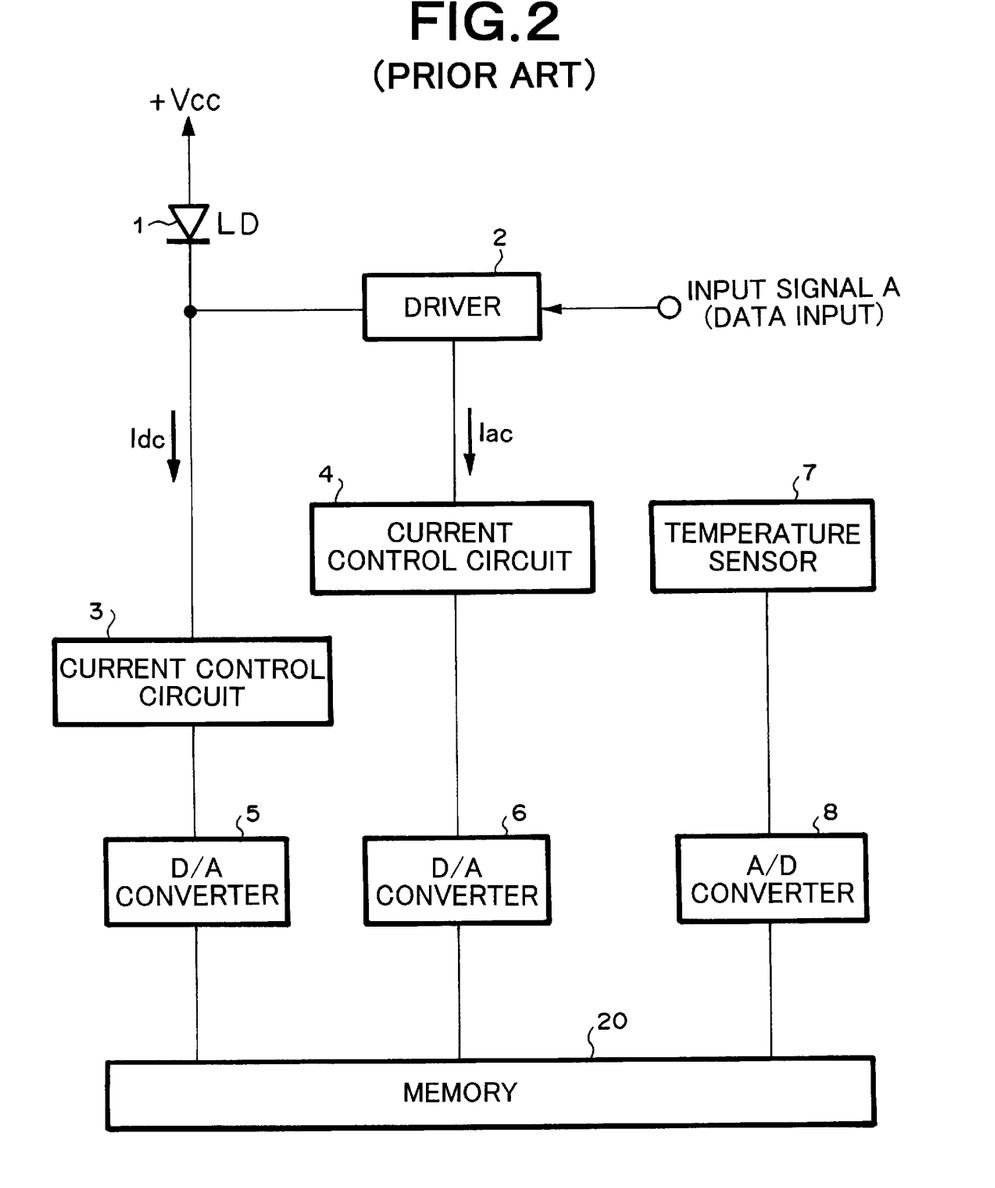
FIG. 2 is a block diagram showing the construction of a conventional optical transmitter.

A conventional optical transmitter is disclosed in Japanese Patent Publication No. 11-135871, for example. FIG. 2 is a block diagram showing the construction of the optical transmitter disclosed in the above publication. The temperature detected by temperature sensor 7 is converted to the value corresponding to the temperature at A/D-converter 8, and then input to memory 20. The memory 20 is stored with the value corresponding to pulse current Iac for pulse-driving LD (Laser Diode) 1 according to the value corresponding to the temperature and the value corresponding to bias current Idc for bias-driving LD1, therefore, the value corresponding to the pulse current Iac and the value corresponding to the bias current Idc according to the value corresponding to the surrounding temperature of the optical transmitter are output from the memory 20.

The value corresponding to the pulse current Iac is D/A-converted at D/A converter 6, and the output of the D/A converter 6 is input into current control circuit 4. The current control circuit 4 converts the value corresponding to the pulse current Iac into the pulse current Iac, and the pulse current Iac is input into driver 2. The driver 2 controls ON/OFF of LD1 emitting light according to input signal A (data input). At this time, the modulated current becomes the pulse current Iac. The value corresponding to the bias current Idc is D/A-converted at D/A converter 5, and the output of the D/A converter 5 is input into current control circuit 3. The current control circuit 3 converts the value corresponding to the bias current Idc into the bias current Idc, and the bias current Idc is supplied to the LD1.

Figures 3A, 3B:
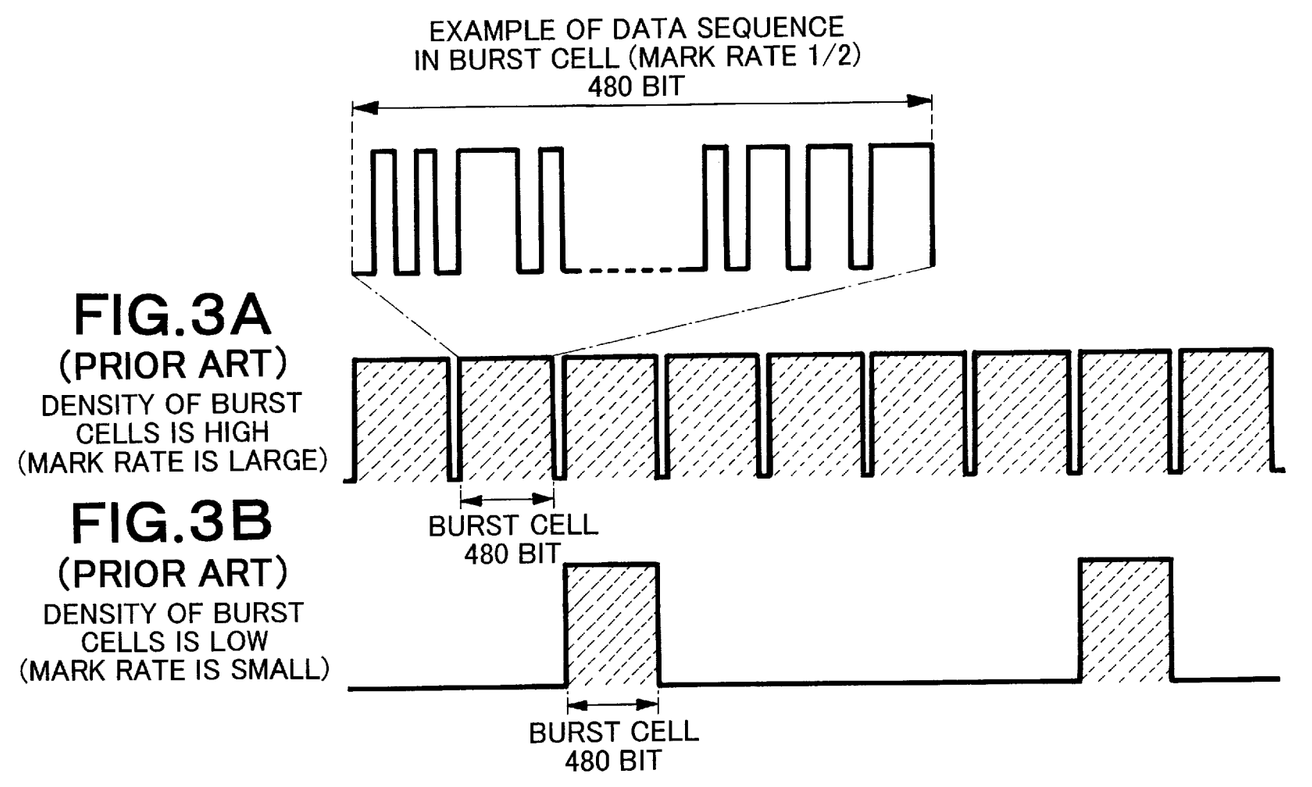
FIGS. 3A and 3B are diagrams showing a case (3A) where the density of burst cells in burst transmission is high and a case (3B) where the density of burst cells in burst transmission is low.

As described above, the PON system burst-transmits the up-signals. In the burst transmission, data are randomly transmitted in a data section of a regulated time unit called as a burst cell. As the number of burst cells may be set to any value, a case where light emission occurs substantially continuously (FIG. 3A) is randomly intermingled with a case where light emission occurs sparsely (FIG. 3B). Even though the surrounding temperature of the optical transmitter is constant, the calorific value is varied in proportion to the amount of light emission from LD, as the density of burst cells is high or low. In the case where the density of the burst cells is high (FIG. 3A), the amount of current flowing in LD is large, and thus the self-calorific value of LD increases. In the case where the density of the burst cells is low (FIG. 3B), the time when the current flows in LD is short, and also the amount of the current is small, and thus the self-calorific value of LD decreases. That is, even though the surrounding temperature of the optical transmission is constant, the peak power of the light output is varied, as the density of burst cells is high or low. The density (high or low) of the burst cells is replaced with the magnitude (large or small) of the mark rate.

It is required to the optical transmitter for performing the burst transmission that the waveform instantaneously rises up from 1 bit of the burst head. However, in the conventional feed-forward type APC, only the surrounding temperature of the optical transmitter is detected, so that variation of the light output due to factors other than the surrounding temperature such as the magnitude of the mark rate or the like cannot be suppressed.

SUMMARY OF THE INVENTION

Therefore, an object of the present invention is to provide a circuit for driving a laser diode which having a feed-forward type APC circuit that can compensate variation of the peak power of the light output due to variation of a mark rate, and a method for driving a laser diode.

In order to attain the above object, the average value of an input signal A is detected by an average value detector, and the value corresponding to the mark rate thereof is input to a memory control circuit. The memory control circuit is connected to plural memories (memory A, memory B, memory C). Each of the memories stores data having different characteristics according to the temperature with respect to the value corresponding to pulse driving current Iac of a laser diode and the value corresponding to bias driving current Idc of the laser diode. The memory control circuit selects a memory to be used according to the mark rate detected, reads out the value corresponding to the pulse driving current Iac and the value corresponding to the bias current Idc according to the temperature from a temperature sensor, and determines the pulse driving current Iac and the bias current Idc. That is, by detecting the mark rate in the average value detector, the memory control circuit adjusts the pulse driving current Iac and the bias driving current Idc on the basis of the mark rate, and controlling the light output and the quenching rate of the laser diode to be constant.

DETAILED DESCRIPTION OF THE PREFERRED EMBODIMENTS

Preferred embodiments of the present invention will be described hereunder with reference to the accompanying drawings.

Figure 4:
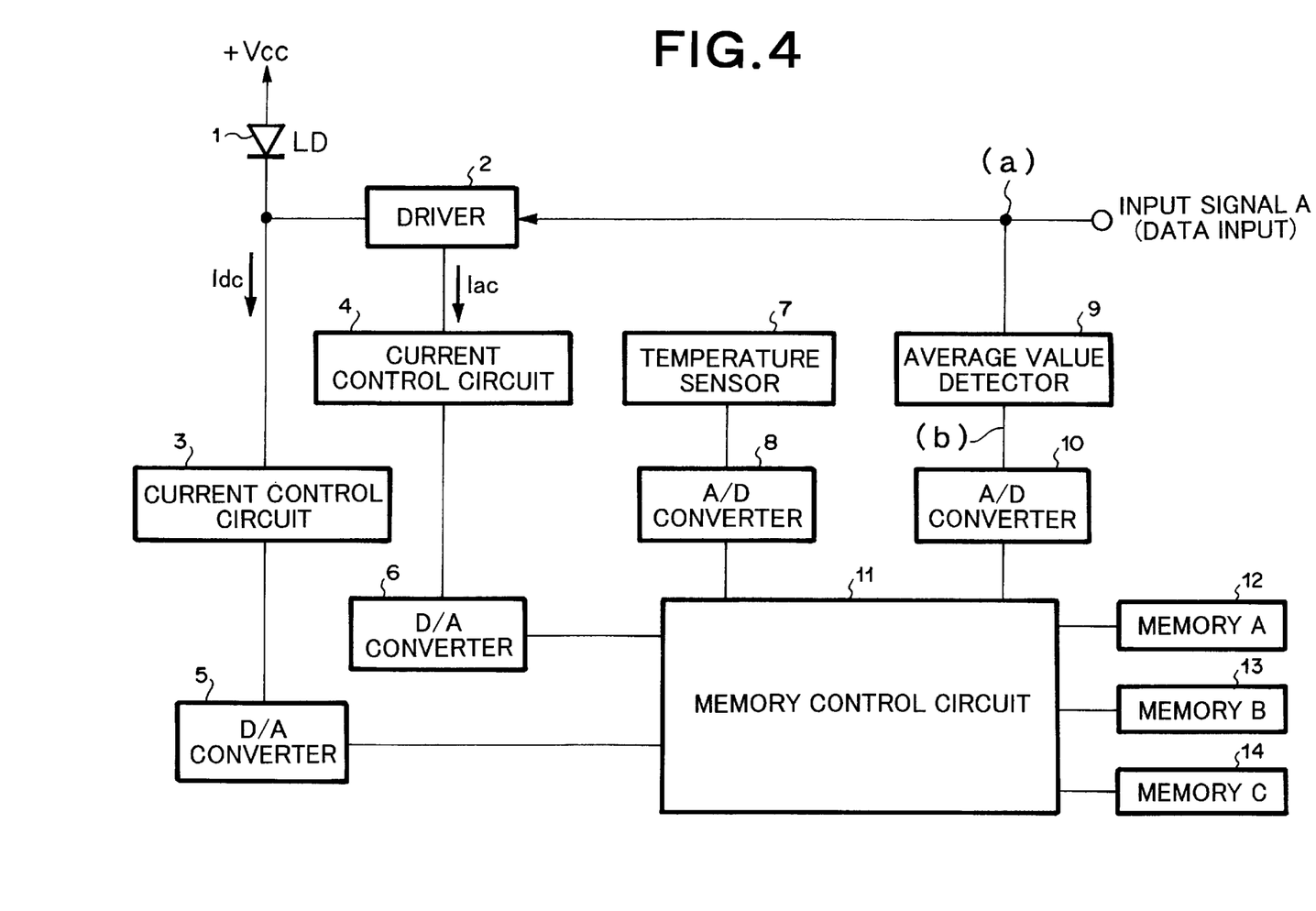
FIG. 4 is a diagram showing the construction of a circuit for a driving laser diode which has a feed-forward type APC circuit.

FIG. 4 shows the construction of a circuit for driving a laser diode which has a feed-forward type APC circuit of the present invention. The average value of the input signal A is detected by an average value detector 9, the value corresponding to the mark rate of the average value is A/D-converted by an A/D converter 10, and then the A/D-converted result is input to a memory control circuit 11. The memory control circuit 11 is connected to plural memory (memory A 12, memory B 13, memory C 14). Each of the memories A 12, B 13, C 14 is stored with the value corresponding to pulse current Iac for pulse-driving LD (laser diode) 1 and the value corresponding to bias current Idc for bias-driving LD1 according to the surrounding temperature of an optical transmitter. The surrounding temperature of the optical transmitter is detected by a temperature sensor 7 and it is converted to the value corresponding to the surrounding temperature of the optical transmitter, the value is input to an A/D converter 8, and then the A/D-converted result is input to the memory control circuit 11.

The memory control circuit 11 selects a memory to be used according to a detected mark rate, reads out the value corresponding to pulse current Iac and the value corresponding to bias current Idc according to the temperature, and outputs the value corresponding to the pulse current Iac to the D/A converter 6 and outputs the value corresponding to the bias current Idc to the D/A converter 5. The value corresponding to the pulse current Iac is D/A-converted by the D/A converter 6, and then the D/A-converted result is input to a current control circuit 4, it is converted to the pulse current Iac. A driver 2 controls ON/OFF of LD1 according to the input signal A. At this time, the current value for pulse-driving LD1 corresponds to the pulse current Iac. Further, the value corresponding to the bias current Idc output from the memory control circuit 11 is D/A-converted by the D/A converter 5, and then the D/A-converted result is input to a current control circuit 3, it is converted to the bias current Idc. The current control circuit 3 is connected to LD1, and controls the bias current Idc flowing in LD1.

Next, the operation of the present invention will be described.

Figure 5A:
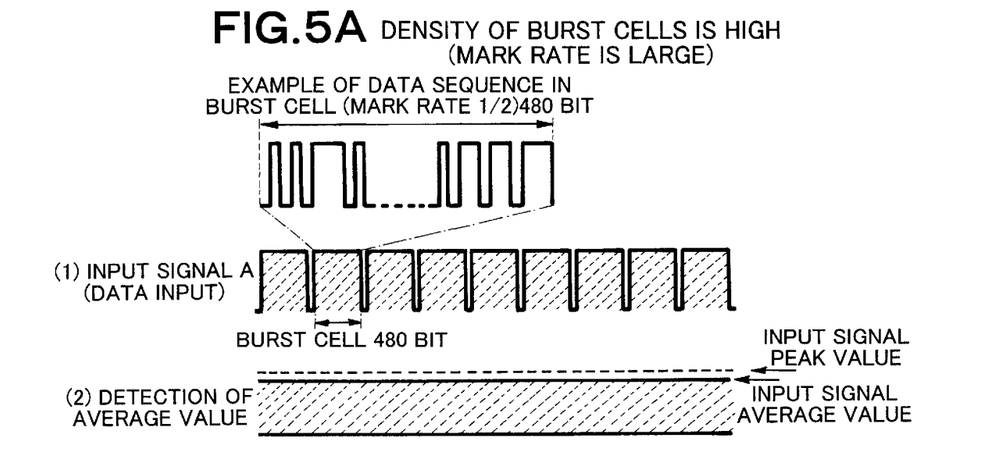
FIGS. 5A to 5C are diagrams showing the waveforms on the time axis at (a), (b) of FIG. 4 in which an input signal A has different states.
Figure 5B:
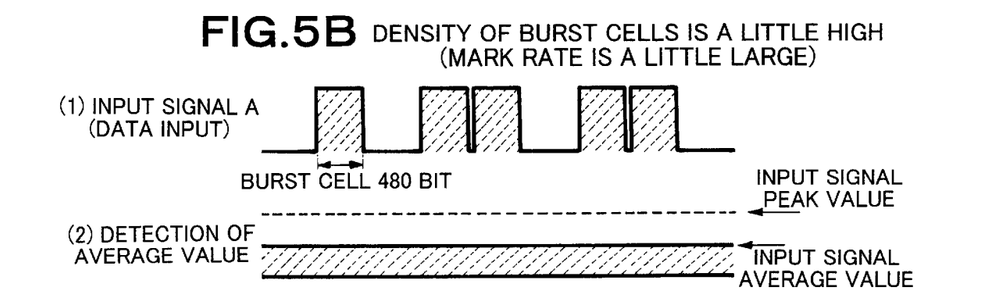
Figure 5C:
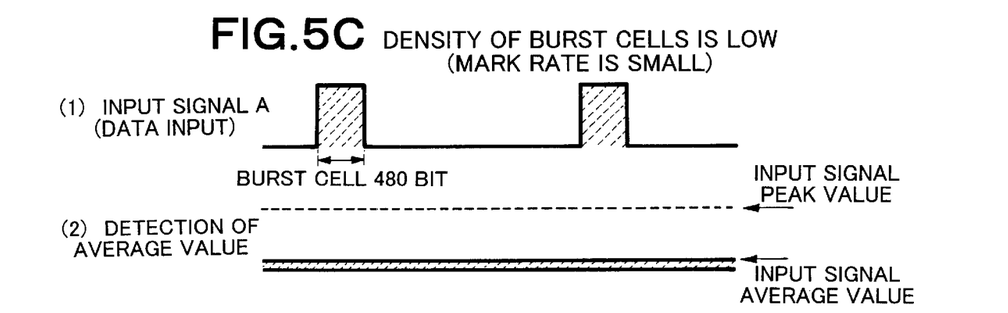

FIGS. 5A to 5C are diagrams showing the waveforms on the time axis at (a), (b) of FIG. 4 in three cases according to the state of the input signal A. The input signal A constitutes a data sequence while a burst cell is set as one unit, and contains pulses having time width defined in each burst cell. In the cases of FIGS. 5A to 5C, the burst cell length is constituted of 480 bits of the data sequence in the burst cell. The mark rate of the data sequence is constantly set to ½. FIGS. 5A to 5C show the operation of the average value detector 9 according to the density (dense or sparse state) of the burst cells of the input signal A.

When the density of the burst cells is high, in other words, the mark rate is large (FIG. 1A), the average value detector 9 outputs a high level. When the density of the burst cells is low, in other words, the mark rate is small (FIG. 5C), the average value detector 9 outputs a low level. That is, the average value detector 9 outputs the value corresponding to the mark rate according to the dense or sparse state of the burst cells. The signal value corresponding to the mark rate which is detected by the average value detector 9 is A/D-converted by the A/D converter 10, and then the A/D-converted result is input to the memory control circuit 11. The memory control circuit 11 selects a memory to be used from the memories A 12, B 13, C 14 according to the value corresponding to the detected mark rate.

Figures 6A, 6B, 6C:
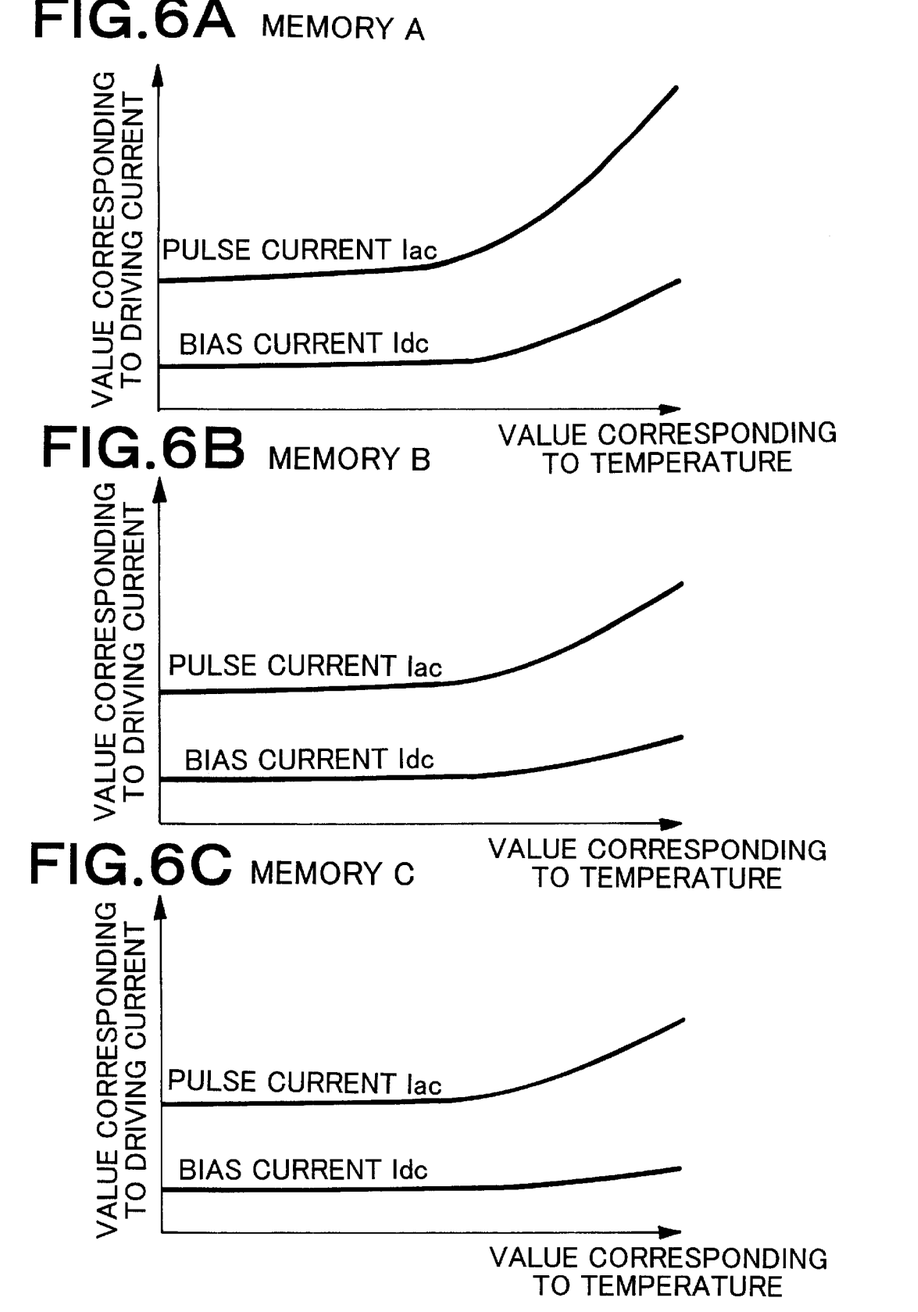
FIGS. 6A to 6C are diagrams showing data having different characteristics which is stored in memories A, B and C respectively.

Each memory is stored with the value corresponding to the pulse current Iac and the value corresponding to the bias current Idc according to the surrounding temperature of the optical transmitter. Each of the memories A 12, B 13 and C 14 is respectively stored with the data having different characteristics as shown in FIGS. 6A to 6C. The memory A is stored with the data having a characteristic of a steep slope of the driving current corresponding to the temperature as shown in FIG. 6A. The memory B is stored with the data having a characteristic of a gentle slope of the driving current corresponding to the temperature as shown in FIG. 6B, and the memory C is stored with the data having a characteristic of a more gentle slope of the driving current corresponding to the temperature as shown in FIG. 6C. For example, when the density of burst cells is high and the mark rate is large, the memory control circuit 11 is preset to select the memory A stored with the characteristic shown in FIG. 6A corresponding to FIG. 5A. Likewise, the memory control circuit 11 is preset to select the memory B stored with the characteristic shown in FIG. 6B corresponding to FIG. 5B, and the memory C stored with the characteristic shown in FIG. 6C corresponding to FIG. 5C.

When the mark rate varies from the state of FIG. 5B in which the mark rate is average state to the state of FIG. 5A in which the mark rate is large, current in LD1 comes to flow substantially constant, so that the surrounding temperature of LD1 rises up. Due to increase of the surrounding temperature of LD1 which is caused by the self-heating, the peak power of the light output is attenuated. The reason for it is that the characteristic of current to light emission of LD1 is deteriorated because of the increase of the surrounding temperature. By detecting the mark rate of the input signal A, the memory A shown in FIG. 6A is selected, and the attenuation of the peak power of the light output is compensated. Further, when the mark rate varies from the state of FIG. 5B in which the mark rate is average state to the state of FIG. 5C in which the mark rate is small, only a small amount of current flows in LD1 at an irregular interval, so that the surrounding temperature of LD1 is reduced and the peak power of the light output increases. The reason for it is that the characteristic of current to light emission of LD1 is improved because of the decrease of the surrounding temperature. At this time, by detecting the mark rate of the input signal A, the memory C shown in FIG. 6C is selected and the increase of the peak power of the light output is compensated. By detecting the dense/sparse (large/small) state of the mark rate as described above, the present invention can adjust the temperature characteristic of the driving current for the laser diode which is based on the mark rate, and it is possible to compensate the variation of the peak power of the light output due to the variation of the mark rate.

Figure 7:
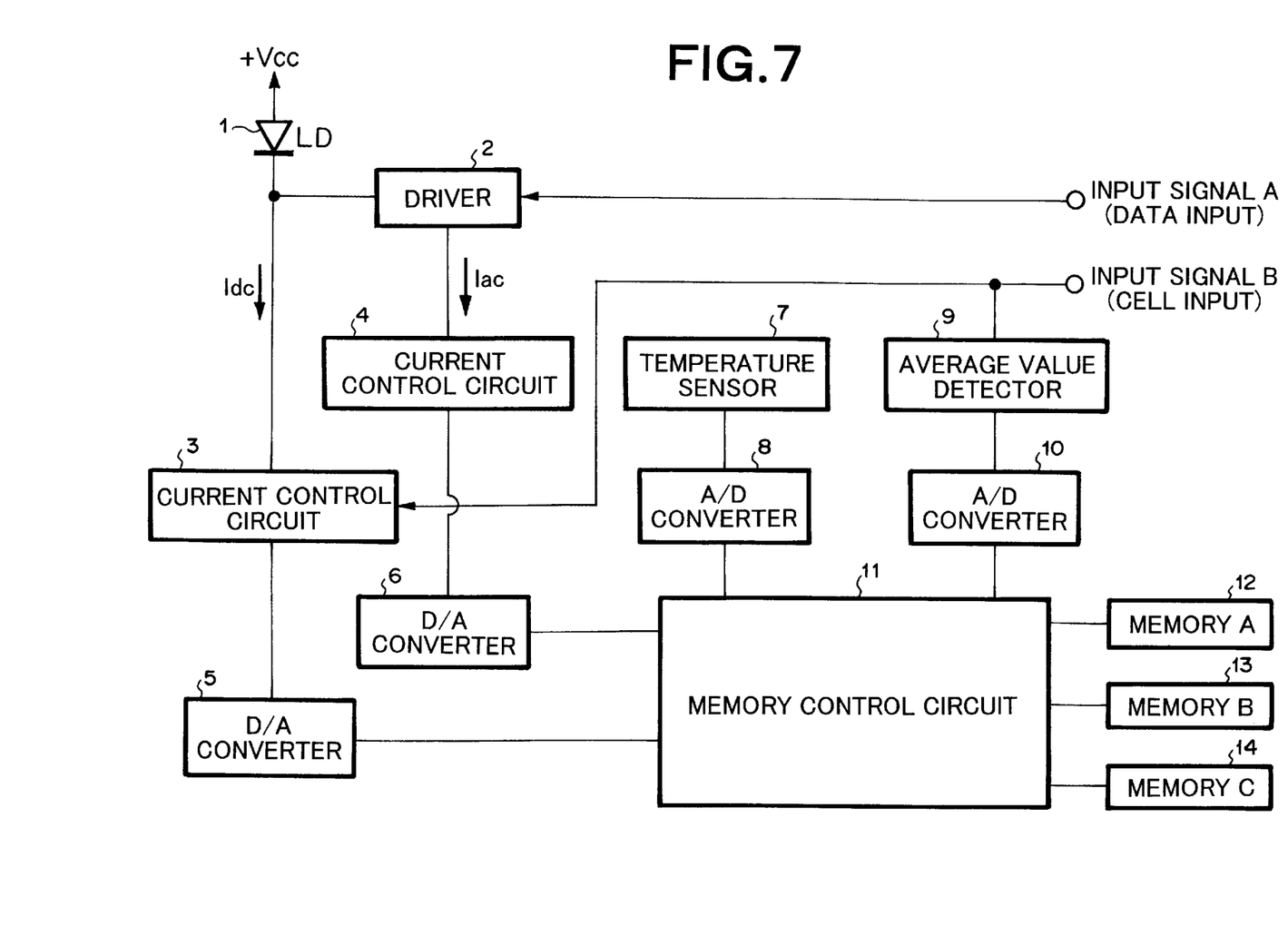
FIG. 7 is a diagram showing the construction of another embodiment in which an input signal B is added to the construction of FIG. 4.

FIG. 7 shows the construction of another embodiment in which the input signal B is added to the construction of FIG.

Figure 8A:
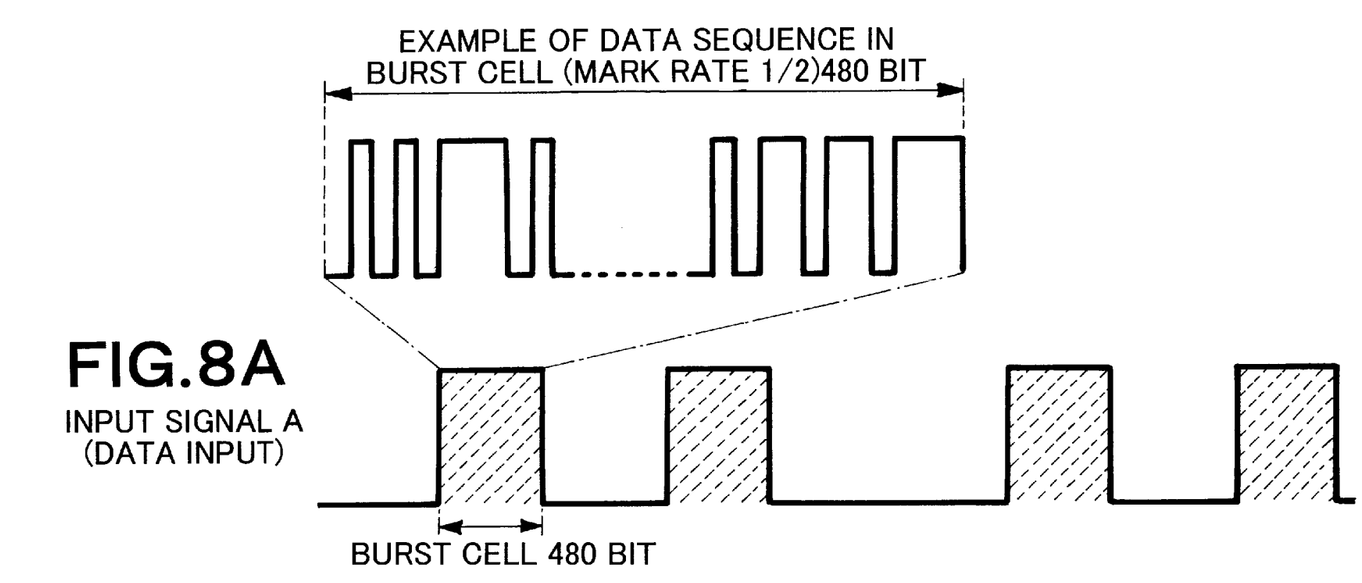
FIGS. 8A and 8B are diagrams showing the relationship between the input signal A (data input) and the input signal B (cell input)
Figure 8B:
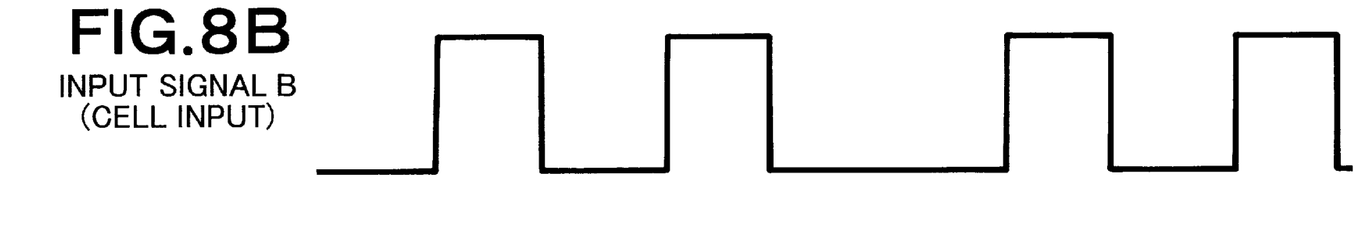

4. FIGS. 8A and 8B show the relationship between the input signal A (data input) and the input signal B (cell input), the input signal B is a signal having the burst cell length which is synchronous with the burst cell. The input signal B is a signal for controlling the current control circuit 3, and it is used for ON/OFF switching the bias current Idc so as to prevent the bias current from flowing so that no light is emitted in a period when there is no input signal A. The mark rate of the burst transmission is determined according to the density of the burst cells, so that the mark rate can be detected by detecting the input signal B. The value corresponding to the mark rate can be got by detecting the average value of the input signal B in the average value detector 9, and thus the present invention can be applied.

Figure 9:
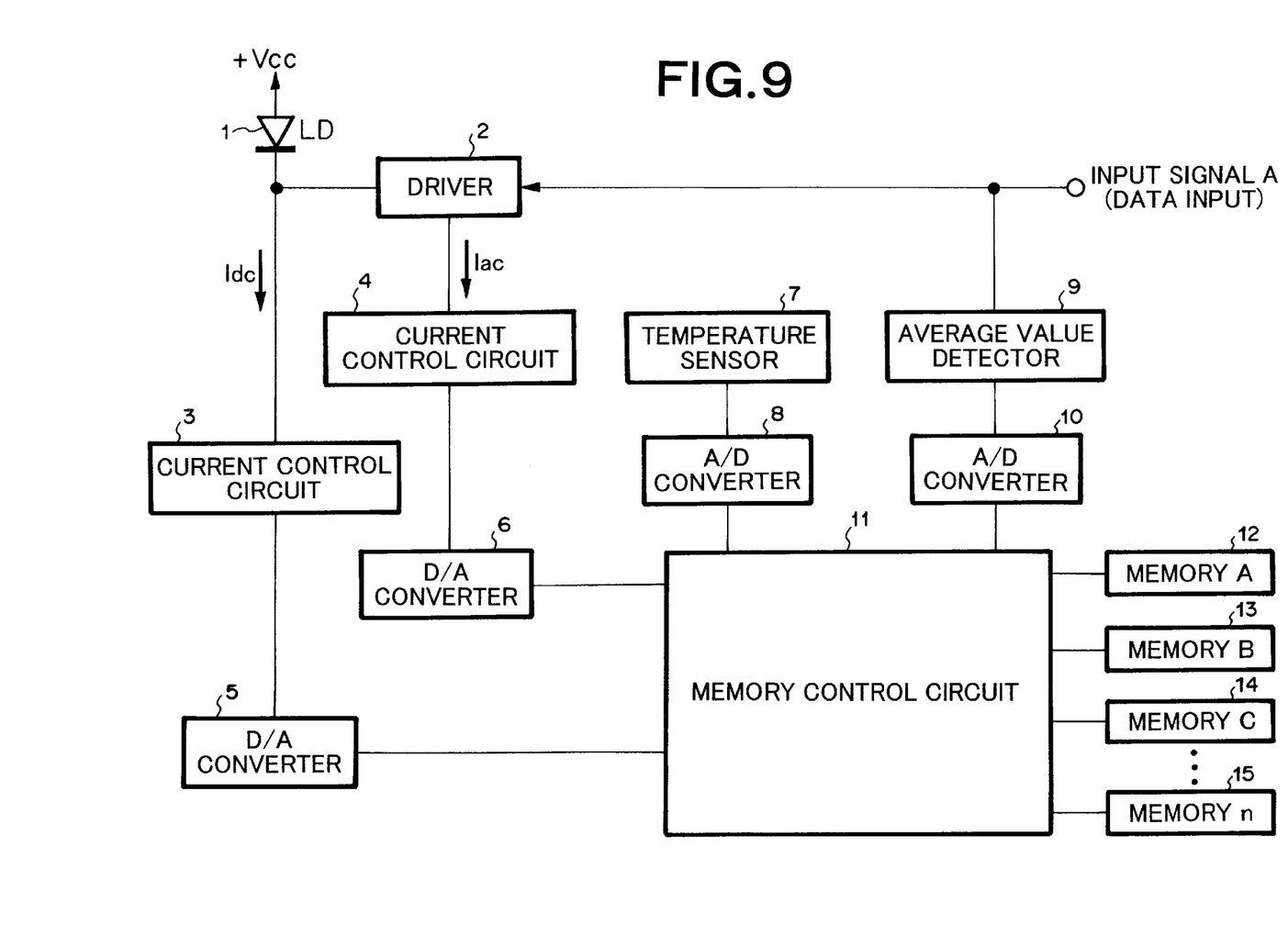
FIG. 9 is a diagram showing the construction of another embodiment in which the number of memories is increased to the construction of FIG. 4.

FIG. 9 shows the construction of another embodiment in which the number of memories is increased to the construction of FIG. 4. The number of memories is three in the embodiment of FIG. 4, however, the mark rate can be more minutely compensated by increasing the number of memories.

As described above, a first effect of the present invention resides in that the present invention can be in feed-forward control of the variation of the peak power of the light output due to the variation of the mark rate. The reason for this is as follows. The conventional circuit determines the driving current for the laser diode by detecting the surrounding temperature of the optical transmitter, and consequently it is impossible to compensate the variation of the surrounding temperature of the laser diode due to the difference (large or small) in the mark rate. However, the present invention has the function of detecting the mark rate of the input signal, and adjusting the setting of the driving current for the light output according to the mark rate.

A second effect of the present invention resides in that the present invention can suppress the variation of the peak power of the light output due to the variation of the mark rate by only the electrical circuit construction without monitoring the light output. The reason for it is that the present invention has the function of detecting the mark rate from only the input signal and adjusting the setting of the driving current for the light output according to the mark rate. The present invention does not monitor the light output, therefore does not need photodiode for monitoring the light output and thus the cost can be reduced.

What is claimed is:

1. A circuit for driving a laser diode which has a feed-forward type APC circuit in an optical transmitter supporting burst mode, comprising:
    a laser diode for emitting transmission signal light;
    a driver circuit for driving said laser diode according to a burst input signal;
    a pulse current control circuit for controlling pulse driving current for said laser diode according to the burst input signal by said driver circuit;
    a bias current control circuit for controlling bias driving current for said laser diode;
    an average value detector circuit for detecting the average value of the burst input signal and outputting the value corresponding to a mark rate;
    a temperature detector circuit for detecting a surrounding temperature of the optical transmitter and outputting a result of it; and
    a memory control circuit connected to plural memories for storing data having different characteristics with respect to the value corresponding to the pulse driving current for said laser diode and the value corresponding to the bias driving current for said laser diode according to the surrounding temperature of the optical transmitter,
    wherein said plural memories include a first memory stored with a characteristic of a steep slope of the driving current corresponding to the temperature, a second memory stored with a characteristic of a gentle slope of the driving current corresponding to the temperature, and a third memory with a characteristic of a more gentle slop of the driving current corresponding to the temperature, and
    wherein said memory control circuit selects one of said first memory, said second memory and said third memory in this order, corresponding to a magnitude of the mark rate from said average value detector circuit, reads out the value corresponding to the pulse driving current for said laser diode and the value corresponding to the bias driving current for said laser diode according to the surrounding temperature of said optical transmitter, and controls the light output and the quenching rate of said laser diode to be constant by adjusting the pulse driving current and the bias driving current.

2. The circuit for driving a laser diode as claimed in claim 1, further comprising:
    a bias current control circuit having a burst cell length which is synchronous with a burst cell of the burst input signal.

3. The circuit for driving a laser diode as claimed in claim 2, wherein said bias control circuit controls the bias driving current so that substantially no light is emitted in a period when there is no burst input signal.

4. A circuit for driving a laser diode as claimed in claim 1, wherein a variation of peak power of the light output due to variation of the mark rate is performed without monitoring the light output.

5. A circuit for driving a laser diode as claimed in claim 1, wherein the mark rate is detected by the average value detector circuit from only the input signal; and adjusting the setting of the driving current for the light output according to the mark.

6. A circuit for driving a laser diode which has a feed-forward type APC circuit in an optical transmitter supporting burst mode, comprising:
    a laser diode for emitting transmission signal light;
    a driver circuit for driving said laser diode according to a burst input signal;
    a pulse current control circuit for controlling pulse driving current for said laser diode according to the burst input signal by said driver circuit;
    a bias current control circuit for receiving a cell synchronous signal having a burst cell length which is synchronous with a burst cell of the burst input signal, and controlling the bias driving current so that substantially no light is emitted in a period when there is no burst input signal by controlling ON/OFF of a bias driving current for said laser diode;
    an average value detector circuit for detecting the average value of the cell synchronous signal and outputting the value corresponding to a mark rate;
    a temperature detector circuit for detecting a surrounding temperature of the optical transmitter and outputting a result of it; and
    a memory control circuit connected to plural memories for storing data having different characteristics with respect to the value corresponding to the pulse driving current for said laser diode and the value corresponding to the bias driving current for said laser diode according to the surrounding temperature of the optical transmitter, wherein said plural memories include a first memory stored with a characteristic of a steep slope of the driving current corresponding to the temperature, a second memory stored with a characteristic of a gentle slope of the driving current corresponding to the temperature, and a third memory stored with a characteristic of a more gentle slope of the driving current corresponding to the temperature, and wherein said memory control circuit selects one of said first memory, said second memory, and said third memory, in this order, corresponding to a magnitude of the mark rate from said average value detector circuit, reads out the value corresponding to the pulse driving current for said laser diode and the value corresponding to the bias driving current for said laser diode according to the surrounding temperature of said optical transmitter, and controls the light output and the quenching rate of said laser diode to be constant by adjusting the pulse driving current and the bias driving current.

7. The circuit for driving a laser diode as claimed in claim 6, wherein said plural memories include characteristic ratios of the driving current corresponding to the temperature, and wherein said memory control circuit selects one of the characteristic ratios according to the magnitude of the mark rate.

8. A method for driving a laser diode by using a feed-forward type APC circuit in an optical transmitter supporting burst mode, wherein the optical transmitter includes a laser diode for emitting transmission signal light, a driver circuit for driving said laser diode according to a burst input signal, a pulse current control circuit for controlling pulse driving current for said laser diode according to the burst input signal by said driver circuit, a bias current control circuit for controlling bias driving current for said laser diode, an average value detector circuit for detecting the average value of the burst input signal and outputting the value corresponding to a mark rate, and a temperature detector circuit for detecting a surrounding temperature of the optical transmitter and outputting a detection result thereof, said method comprising:

storing plural memories with data having different characteristics with respect to the value corresponding to the pulse driving current for said laser diode and the value corresponding to the bias driving current for said laser diode according to the surrounding temperatures of the optical transmitter, said plural memories including a first memory stored with a characteristic of a steep slope of the driving current corresponding to the temperature, a second memory stored with a characteristic of a gentle slope of the driving current corresponding to the temperature, and a third memory stored with a characteristic of a more gentle slope of the driving current corresponding to the temperature;

selecting a memory to be used from said plural memories according to the mark rate from said average value detector circuit, said memory control circuit selecting said first memory, said second memory, and said third memory, in this order, corresponding to a magnitude of the mark rate;

reading out the value corresponding to the pulse driving current for said laser diode and the value corresponding to the bias driving current for said laser diode according to the surrounding temperature of said optical transmitter; and controlling the light output and the quenching rate of said laser diode to be constant by adjusting the pulse driving current and the bias driving current.

9. A method for driving a laser diode by using a feed-forward type APC circuit in an optical transmitter supporting burst mode, wherein the optical transmitter includes a laser diode for emitting transmission signal light, a driver circuit for driving said laser diode according to a burst input signal, a pulse current control circuit for controlling pulse driving current for said laser diode according to the burst input signal by said driver circuit, a bias current control circuit for receiving a cell synchronous signal having a burst cell length which is synchronous with a burst cell of the burst input signal, and controlling the bias driving current so that substantially no light is emitted in a period when there is no burst input signal by controlling ON/OFF of a bias driving current for said laser diode, an average value detector circuit for detecting the average value of the cell synchronous signal and outputting the value corresponding to a mark rate, and a temperature detector circuit for detecting a surrounding temperature of the optical transmitter and outputting a detection result thereof, said method comprising:

storing plural memories with data having different characteristics with respect to the values corresponding to the pulse driving current for said laser diode and the value corresponding to the bias driving current for said laser diode according to the surrounding temperature of the optical transmitter, said plural memories including a first memory stored with a characteristic of a steep slope of the driving current corresponding to the temperature, a second memory stored with a characteristic of a gentle slope of the driving current corresponding to the temperature, and a third memory stored with a characteristic of a more gentle slope of the driving current corresponding to the temperature;

selecting a memory to be used from said plural memories according to the mark rate from said average value detector circuit, said memory control circuit selecting said first memory, said second memory, and said third memory, in this order, corresponding to the magnitude of the mark rate;

reading out the value corresponding to the pulse driving current for said laser diode and the values corresponding to the bias driving current for said laser diode according to the surrounding temperature of said optical transmitter; and controlling the light output and the quenching rate of said laser diode to be constant by adjusting the pulse driving current and the bias driving current.

10. A circuit for driving a laser diode, comprising:

a laser diode for emitting a transmission signal light;

an average value detector circuit for detecting the average value of the burst input signal and outputting the average value corresponding to a mark rate; and a memory control circuit selecting a pulse driving current value for said laser diode and a bias driving current value for said laser diode according to the mark rate.

11. The circuit for driving a laser diode as claimed in claim 10, wherein said memory control circuit adjusts the setting of the pulse driving current and the bias driving current to control light output from said laser diode.

12. The circuit for driving a laser diode as claimed in claim 10, further comprising:

a bias current control circuit having a burst cell length which is synchronous with a burst cell of a burst input signal, wherein said bias control circuit controls the bias driving current so that substantially no light is emitted in a period when there is no burst input signal.

13. The circuit for driving a laser diode as claimed in claim 10, wherein the memory control circuit stores data having different characteristics with respect to the value corresponding to the pulse driving current for said laser diode and the value corresponding to the bias driving current for said laser diode according to a surrounding temperature of the optical transmitter.

14. A method for driving a laser diode, comprising:

detecting a mark rate of an input signal into a circuit for driving said laser diode;

detecting a temperature, with a temperature detector, surrounding said laser diode and outputting a result of said temperature detection to said memory control circuit; and adjusting a driving current for light output of said laser diode according to said mark rate.

15. The method for driving a laser diode as claimed in claim 14, further comprising:

suppressing a variation of peak power of light output in said laser diode cause by a variation in said mark rate without monitoring light output of said laser diode.

16. The method for driving a laser diode as claimed in claim 14, wherein said adjusting of said driving current comprises selecting a pulse driving current value and a bias driving current value according to the mark rate.

17. The method for driving a laser diode as claimed in claim 16, further comprising providing a bias current control circuit having a burst cell length which is synchronous with a burst cell of a burst input signal; and controlling the bias driving current with said bias current control circuit, wherein substantially no light is emitted from said laser diode in a period when there is no burst input signal.

18. The method for driving a laser diode as claimed in claim 14, further comprising:

saving characteristic ratios of the driving current corresponding to temperatures of said laser diode; and selecting one of the characteristic ratios corresponding to the magnitude of the mark rate.

* * * * *